United States Patent [19]

Matsuda

[11] Patent Number: 4,507,578
[45] Date of Patent: Mar. 26, 1985

[54] FREQUENCY DISCRIMINATING CIRCUIT

[75] Inventor: Khoichi Matsuda, Tokyo, Japan

[73] Assignee: Pioneer Electronic Corporation, Tokyo, Japan

[21] Appl. No.: 389,354

[22] Filed: Jun. 17, 1982

[30] Foreign Application Priority Data

Jun. 18, 1981 [JP] Japan .................................. 56-94447

[51] Int. Cl.$^3$ ............................................... H03J 5/00
[52] U.S. Cl. .................................... 307/520; 307/524; 307/358; 328/147; 328/149
[58] Field of Search ....................... 328/167, 147, 149; 307/520, 522, 524, 358

[56] References Cited

U.S. PATENT DOCUMENTS

| 3,103,601 | 9/1963 | Gordon et al. | 307/520 |
| 3,555,435 | 1/1971 | Vosteen | 307/524 |
| 4,079,250 | 3/1978 | Jeffcoat | 328/147 |
| 4,358,738 | 11/1982 | Kahn | 307/358 |

Primary Examiner—John S. Heyman
Attorney, Agent, or Firm—Sughrue, Mion, Zinn, Macpeak, and Seas

[57] ABSTRACT

A frequency discriminating circuit is provided with multiple comparators corresponding in number to the number of frequencies to be discriminated, and the signal input to each comparator is also connected to each remaining comparator so as to raise the reference levels of the remaining comparators.

3 Claims, 2 Drawing Figures

FREQUENCY DISCRIMINATING CIRCUIT

BACKGROUND OF THE INVENTION

This invention relates to a frequency discriminating circuit for discriminating a plurality of signals of different frequency.

In a channel up/down control or a volume up/down control in a remote control type receiver, up and down control signals of different frequencies are provided by the control section, and the frequencies of the control signals are discriminated on the receiver side. For this purpose, a frequency discriminating circuit for discriminating the frequencies of the two signals is employed.

FIG. 1 shows one example of a conventional frequency discriminating circuit which comprises capacitors $C_1$ and $C_2$ for cutting off the DC components of the input signals, active filters 1 and 2 having selectivity characteristics corresponding to the frequencies of the input signals, rectifier circuits 3 and 4 for rectifying the outputs of the filters, and output transistors $Q_1$ and $Q_2$. These circuit elements are provided separately according to the two input signals of different frequency, in this case. The input signals are detected by the filters 1 and 2 corresponding to the frequencies thereof, and are then rectified by the rectifier circuits 3 and 4, to thereby drive the output transistors $Q_1$ and $Q_2$, respectively. However, when two signals at levels higher than certain values are inputted simultaneously, or when the difference in frequency between two input signals is small, or when the selectivity characteristics of the filters 1 and 2 are broad, then the two output transistors $Q_1$ and $Q_2$ may be turned on at the same time, which causes erroneous operation.

SUMMARY OF THE INVENTION

An object of this invention is to provide a frequency discriminating circuit in which such erroneous operation is positively prevented.

The frequency discriminating circuit according to the invention has a plurality of comparators which are provided separately according to a plurality of signals of different frequency, the comparators providing outputs when the levels of the signals are higher than respective reference levels. In the frequency discriminating circuit, a signal input to one of the plurality of comparators is employed to control the reference levels of the other comparators.

BRIEF DESCRIPTION OF THE DRAWINGS

One embodiment of this invention will be described with reference to the accompanying drawings, in which.

DETAILED DESCRIPTION OF THE PREFERRED EMBODIMENTS

Figure 1:
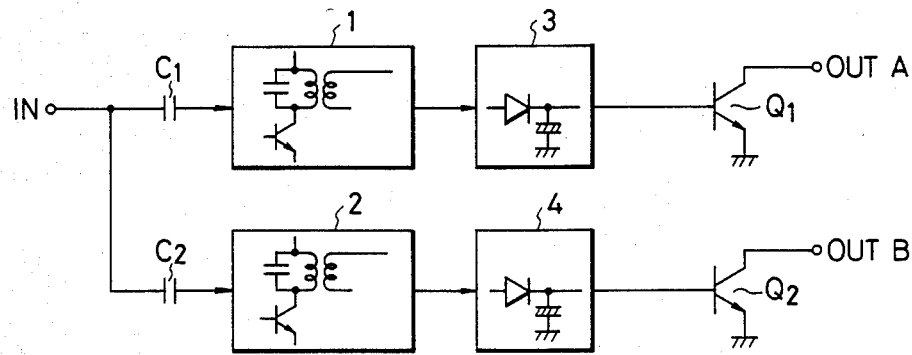
FIG. 1 is a block diagram showing a conventional frequency discriminating circuit.
Figure 2:
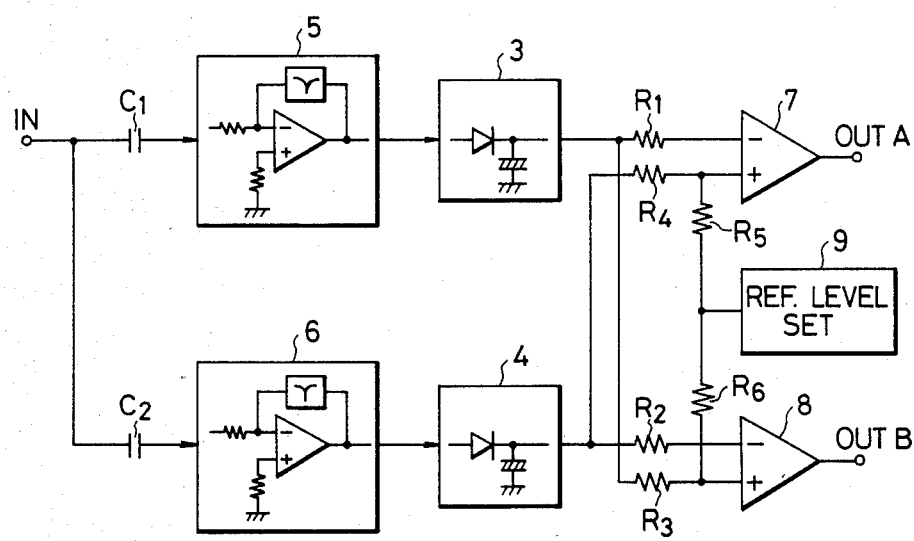
FIG. 2 is a block diagram showing one example of a frequency discriminating circuit according to this invention.

FIG. 2 is a block diagram showing one example of a frequency discriminating circuit according to one embodiment of the invention. In FIG. 2, those components which have been previously described with reference to FIG. 1 are accordingly designated by the same reference numerals or characters.

The frequency discriminating circuit in FIG. 2 will be described with reference to the case where two signals having different frequencies $f_A$ and $f_B$ are discriminated, for simplification in description. An input signal IN is applied to active filters 5 and 6 through the DC component blocking capacitors $C_1$ and $C_2$. The tuning frequencies of the active filters 5 and 6 are $f_A$ and $f_B$, respectively. The signals which have been selected and amplified by the active filters 5 and 6 are rectified by the rectifier circuits 3 and 4 into DC voltages corresponding to the signal levels, respectively. The outputs of the rectifier circuits 3 and 4 are applied through resistors $R_1$ and $R_2$ to the inverting input terminals of comparators 7 and 8, respectively, and are applied through resistors $R_3$ and $R_4$ to the non-inverting input terminals of the comparators 8 and 7, respectively.

A reference level setting circuit 9 is provided to set the reference levels which are compared with the levels of the input signals. The reference level setting circuit 9 thus applies predetermined reference voltages to the non-inverting input terminals of the comparators 7 and 8, respectively, through the resistors $R_5$ and $R_6$.

When a signal having the frequency $f_A$ is applied to the circuit thus organized, the signal is amplified by the active filter 5 and is then converted into a DC voltage corresponding to the signal level by the rectifier circuit 3. The DC voltage is applied, as the inverting input, to the comparator. When the level of this input signal is higher than the reference level preset by the reference level setting circuit 9, the output of the comparator is changed from the high level to the low level, for instance, thus determining that the signal is effective. In this operation, the signal of the frequency $f_A$ is further applied to the active filter 6; however, the output level of the comparator 8 is not changed, if the selectivity characteristic of the filter is steep.

However, if the difference between the freuqencies $f_A$ and $f_B$ of the two signals is small or if the selectivity characteristics of the filters are broad, then the output voltage of the rectifier circuit 4 is slightly increased, and the output level of the comparator 8 may be changed, thus causing an erroneous operation. In order to eliminate this difficulty, in the circuit according to the invention, the output terminals of the rectifier circuits 3 and 4 are connected through the resistors $R_3$ and $R_4$ to the non-inverting input terminals of the comparators 8 and 7, respectively, so that the reference levels are are controlled by the input signal. Owing to this arrangement, when the signal of frequency $f_A$ is input and the output level of the rectifier circuit 3 becomes higher than the reference level of the comparator 7, the output level of the comparator 7 is inverted, but the reference level of the comparator 8 is increased through the resistor $R_3$. Accordingly, even if the output of the rectifier circuit 4 is slightly increased, the output of the comparator 8 is not inverted. In the case when the signal of frequency $f_B$ is inputted, the operation is opposite to that described above. The output of the comparator 8 is inverted, while the reference level of the comparator 7 is increased. Accordingly, both outputs of the comparators 7 and 8 are inverted only when two signals having the frequencies $f_A$ and $f_B$ are inputted with the same level at the same time.

While the above embodiment has been described with reference to the case where two signals are discriminated, the invention is not limited thereto or thereby. That is, the technical concept of the invention can be applied to a circuit for discriminating more than two input signals, by changing the reference levels with the respective rectification output.

As is apparent from the above description, the frequency discriminating circuit is free from erroneous operation even if the difference in frequency of a plurality signals is small or the filters have broad selectivity characteristics. Accordingly, not only can the filters be readily designed, but also, plural signal frequencies can be readily set up. The frequency discrimminating circuit of the invention is, accordingly, suitable for discriminating, for instance, channel up/down control signals or volume up/down control signals in remote control type receivers.

What is claimed is:

1. A frequency discriminating circuit for discriminating a plurality of signals of different frequency, comprising:

a plurality of comparators provided according to said plurality of signals, said comparators respectively providing outputs when the levels of said signals are higher than respective reference levels;

a common reference level setting circuit to establish an initial predetermined reference level input to said comparators;

an input signal to any one of said plurality of comparators being used to increase the reference levels of the other comparators; and for each frequency to be discriminated, an active filter tuned to the respective frequency, and a rectifier coupled to the filter, an output of each rectifier being connected to a first input of a respective comparator, and being connected to a second input of the remaining comparators.

2. A circuit as claimed in claim 1, including reference level setting means connected to a second input of each comparator.

3. A circuit as claimed in claim 1, said second inputs of said comparators comprising reference level inputs.

* * * * *